(12) United States Patent  
Metoki

(10) Patent No.: US 10,189,089 B2
(45) Date of Patent: Jan. 29, 2019

(54) COATED CUTTING TOOL

(71) Applicant: TUNGALOY CORPORATION, Iwaki-shi, Fukushima (JP)

(72) Inventor: Kenji Metoki, Iwaki (JP)

(73) Assignee: TUNGALOY CORPORATION, Iwaki-Shi, Fukushima (JP)

( * ) Notice: Subject to any disclaimer, the term of this patent is extended or adjusted under 35 U.S.C. 154(b) by 0 days.

(21) Appl. No.: 15/328,570

(22) PCT Filed: Jul. 24, 2015

(86) PCT No.: PCT/JP2015/071064
§ 371 (c)(1),
(2) Date: Jan. 24, 2017

(87) PCT Pub. No.: WO2016/013645
PCT Pub. Date: Jan. 28, 2016

(65) Prior Publication Data
US 2017/0216928 A1 Aug. 3, 2017

(30) Foreign Application Priority Data
Jul. 25, 2014 (JP) ................................. 2014-151307

(51) Int. Cl.
*B32B 27/14* (2006.01)
*B23B 27/14* (2006.01)
(Continued)

(52) U.S. Cl.
CPC ............ *B23B 27/148* (2013.01); *B23B 27/14* (2013.01); *B23B 51/00* (2013.01); *B23C 5/16* (2013.01);
(Continued)

(58) Field of Classification Search
CPC ..... B32B 27/14; B32B 51/00; B32B 2222/16; B32B 2222/28; B32B 2226/125;
(Continued)

(56) References Cited

U.S. PATENT DOCUMENTS

2007/0178330 A1    8/2007  Sjolen et al.
2010/0215951 A1*   8/2010  Shibata ................. C23C 28/042
                                                              428/336

FOREIGN PATENT DOCUMENTS

JP    2011-104737 A    6/2011
JP    2011-189436 A    9/2011
(Continued)

OTHER PUBLICATIONS

Havey et al., The chemistry, structure, and resulting wear properties of magnetron-sputtered NbN thin films, 1997, Thin Solid Films, 303, pp. 238-245. (Year: 1997)*

(Continued)

*Primary Examiner* — Humera N Sheikh
*Assistant Examiner* — Elizabeth Collister
(74) *Attorney, Agent, or Firm* — Foley & Lardner LLP

(57) ABSTRACT

A coated cutting tool includes a substrate and a coating layer formed onto the surface of the substrate. The coating layer contains an outermost layer. The outermost layer contains NbN. The NbN contains cubic NbN and hexagonal NbN. When a peak intensity at a (200) plane of cubic NbN is made $I_c$, a peak intensity at a (101) plane of the hexagonal NbN is made $I_{h1}$, and a sum of peak intensities at a (103) plane and a (110) plane of the hexagonal NbN is made $I_{h2}$ in X-ray diffraction analysis, a ratio $[I_{h1}/(I_{h1}+I_c)]$ of $I_{h1}$ based on a sum of $I_c$ and $I_1$ is 0.5 or more and less than 1.0, and a ratio $[I_{h1}/(I_{h1}+I_{h2})]$ of $I_{h1}$ based on a sum of $I_{h1}$ and $I_{h2}$ is 0.5 or more and 1.0 or less.

20 Claims, 1 Drawing Sheet

(51) Int. Cl.
| | |
|---|---|
| *B23B 51/00* | (2006.01) |
| *B23C 5/16* | (2006.01) |
| *B23C 5/20* | (2006.01) |
| *C23C 14/02* | (2006.01) |
| *C23C 14/06* | (2006.01) |
| *C23C 28/04* | (2006.01) |
| *C23C 28/00* | (2006.01) |
| *C23C 30/00* | (2006.01) |

(52) U.S. Cl.
CPC ............. *B23C 5/20* (2013.01); *C23C 14/022* (2013.01); *C23C 14/0641* (2013.01); *C23C 28/044* (2013.01); *C23C 28/42* (2013.01); *C23C 28/44* (2013.01); *C23C 30/005* (2013.01); *B23B 2222/16* (2013.01); *B23B 2222/28* (2013.01); *B23B 2226/125* (2013.01); *B23B 2226/18* (2013.01); *B23B 2228/08* (2013.01); *B23B 2228/105* (2013.01); *B23B 2228/36* (2013.01); *B23C 2222/16* (2013.01); *B23C 2222/28* (2013.01); *B23C 2226/125* (2013.01); *B23C 2226/18* (2013.01); *B23C 2228/08* (2013.01); *B23C 2228/10* (2013.01)

(58) Field of Classification Search
CPC ............ B32B 2226/18; B32B 2228/08; B32B 2228/105; B32B 2228/36; B32B 27/148; B23C 5/16; B23C 2222/16; B23C 2222/28; B23C 2226/125; B23C 2226/18; B23C 2228/08; B23C 2228/10; B23C 5/20; C23C 14/022; C23C 14/0641; C23C 28/044; C23C 28/42; C23C 28/44; C23C 30/005
USPC ......................... 428/697, 698, 699, 336, 216
See application file for complete search history.

(56) References Cited

FOREIGN PATENT DOCUMENTS

| JP | 2012-024855 A | 2/2012 |
|---|---|---|
| WO | WO 2009/35396 | 3/2009 |

OTHER PUBLICATIONS

Zhitomirsky, V. N., "Structure and Properties of Cathodic Vacuum Arc Deposited NbN and NbN-based Multi-component and Multi-layer Coatings," Science Direct, Surface & Coatings Technology, vol. 201, No. 13, Feb. 8, 2007, pp. 6122-6130.
Extended European Search Report, issued in corresponding European Patent Application No. 15825247.8 dated Dec. 20, 2017.
International Search Report dated Oct. 20, 2015 issued in counterpart International (PCT) Application (No. PCT/JP2015/071064).
Written Opinion dated Oct. 20, 2015 issued in counterpart International (PCT) Application (No. PCT/JP2015/071064).

* cited by examiner

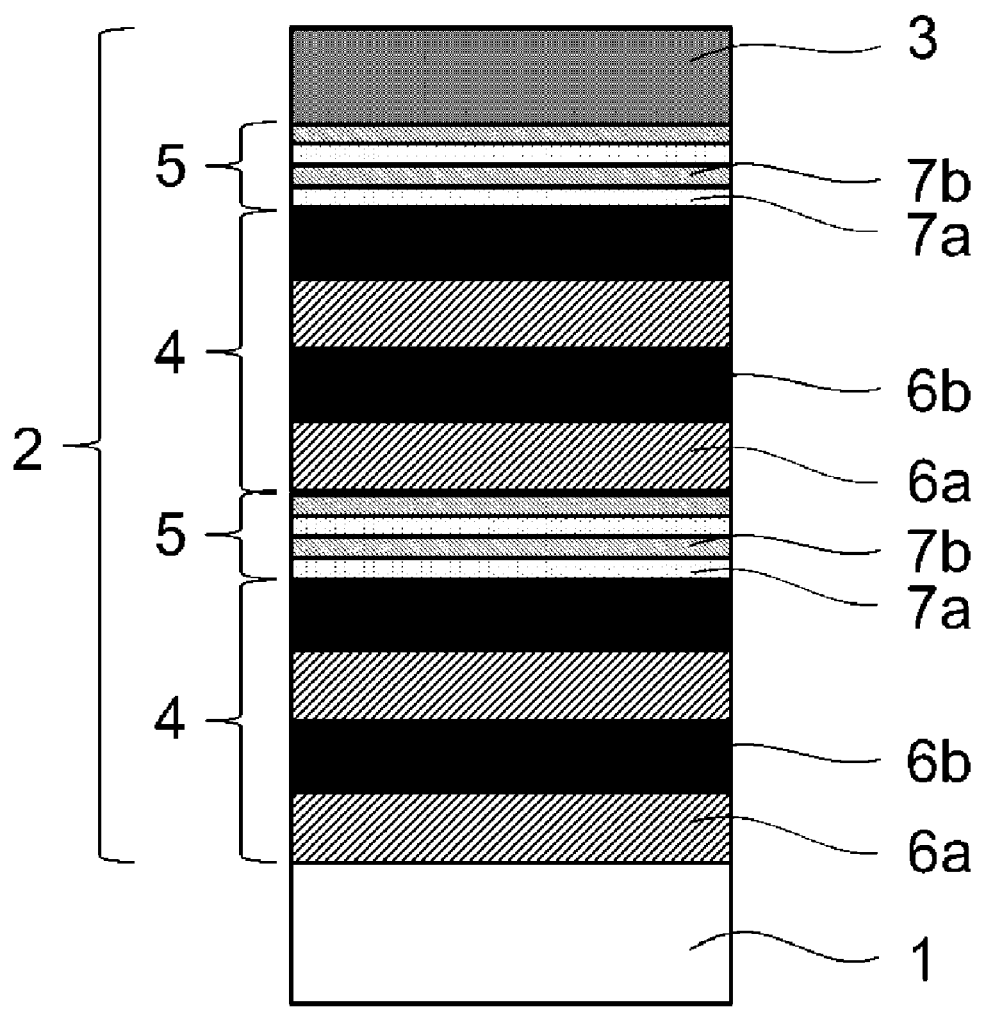

COATED CUTTING TOOL

RELATED APPLICATIONS

This is a 371 US National Phase of International Patent Application No. PCT/JP2015/071064 filed Jul. 24, 2015 and published as WO 2016/013645A1 on Jan. 28, 2016, which claims priority to JP 2014-151307, filed Jul. 25, 2014. The contents of the aforementioned applications are incorporated by reference in their entirety.

TECHNICAL FIELD

The present invention relates to a coated cutting tool.

BACKGROUND ART

In recent years, demand of high efficiency in cutting has been increased. Accompanying with increase of this demand, a cutting tool having a longer tool life than those of the conventional ones has been required. Therefore, as characteristics required for the tool materials, it is important to improve characteristics relating to lifetime of a cutting tool. For example, it is more important to improve wear resistance and fracture resistance of the cutting tool. To improve these characteristics, a coated cutting tool which comprises a substrate such as a cemented carbide, cermet, cBN, etc., and one layer or two or more layers of a coating layer such as a TiN layer, a TiAlN layer, etc., formed on the surface thereof has widely been used.

Thus, various techniques to improve characteristics of such a coating layer have been proposed. In Patent document 1, for example, it has been disclosed a coated cutting tool in which a value $I_h/I_c$ which is a ratio of a sum Ih of a diffraction peak intensity at a (103) plane of hexagonal niobium nitride and a diffraction peak intensity at a (110) plane of the hexagonal niobium nitride with a diffraction peak intensity $I_c$ at a (220) plane of cubic niobium nitride is 2.0 or less when a hard coating layer is measured by X-ray diffraction. The coated cutting tool is disclosed to be excellent in cutting performance of a Ti alloy.

In Patent document 2, it has been disclosed a coated cutting tool in which a value $I_c/I_h$ which is a ratio of a sum Ih of a diffraction peak intensity at a (103) plane of hexagonal niobium nitride and a diffraction peak intensity at a (110) plane of the hexagonal niobium nitride with a diffraction peak intensity $I_c$ at a (200) plane of cubic niobium nitride is 0.05 to 1.0 when a hard coating layer is measured by X-ray diffraction. The coated cutting tool is disclosed to be excellent in lubricity and wear resistance.

PRIOR ART DOCUMENTS

Patent Documents

Patent document 1: WO 2009/035396A
Patent document 2: JP 2011-104737A

SUMMARY OF THE INVENTION

Problems to be Solved by the Invention

In recent years, high speed, high feeding and deep cutting in a cutting process become more remarkable. Thus, fracture of the tool has been frequently generated. For example, due to the load applied to the blade edge during the processing, cracks are generated at the surface of the tool. By propagating the cracks to the substrate, fracture of the tool is generated. In addition, if a temperature of the blade edge is rapidly raised or lowered, cracks are generated at the substrate. By propagating the cracks to the coating layer, fracture of the tool is generated.

Under such a background, while the coated cutting tools disclosed in the above-mentioned Patent document 1 and Patent document 2 are excellent in wear resistance at high temperature, there are problems that chipping resistance and fracture resistance are insufficient since the effect of suppressing occurrence of cracks is not sufficient.

The present invention has been done to solve these problems. An object of the present invention is to provide a coated cutting tool excellent in chipping resistance and fracture resistance without lowering wear resistance even in more severe cutting processing. In addition, an object of the present invention is to provide a coated cutting tool which can work for a long period of time.

Means to Solve the Problems

The present inventor has intensively studied on elongation of tool life of a coated cutting tool. The present inventor was able to improve chipping resistance and fracture resistance of a coated cutting tool without lowering wear resistance by the following constitution. As a result, tool life of the coated cutting tool could be elongated.

That is, the summary of the present invention is as follows.

(1) A coated cutting tool which comprises a substrate and a coating layer formed onto a surface of the substrate, wherein
the coating layer contains an outermost layer,
the outermost layer contains NbN,
the NbN contains cubic NbN and hexagonal NbN,
when a peak intensity at a (200) plane of the cubic NbN by X-ray diffraction analysis is made $I_c$, a peak intensity at a (101) plane of the hexagonal NbN is made $I_{h1}$, and a sum of peak intensities at a (103) plane and a (110) plane of the hexagonal NbN is made $I_{h2}$,
then a ratio $[I_{h1}/(I_{h1}+I_c)]$ of $I_{h1}$ based on a sum of $I_c$ and $I_{h1}$ is 0.5 or more and less than 1.0, and
a ratio $[I_{h1}/(I_{h1}+I_{h2})]$ of $I_{h1}$ based on a sum of $I_{h1}$ and $I_{h2}$ is 0.5 or more and 1.0 or less.

(2) The coated cutting tool of (1), wherein a full width at half maximum intensity (FWHM) of a peak at a (101) plane of the hexagonal NbN is 0.2° or more and 0.6° or less.

(3) The coated cutting tool of (1) or (2), wherein the NbN contains 25 atomic % or less of at least one kind of an element selected from the group consisting of Ti, Zr, Hf, V, Ta, Cr, Mo, W, Al, Si, Sr and Y.

(4) The coated cutting tool of any one of (1) to (3), wherein an average thickness of the outermost layer is 0.05 μm or more and 3 μm or less.

(5) The coated cutting tool of any one of (1) to (4), wherein the coating layer contains an inner layer between the substrate and the outermost layer, and
the inner layer is one or a plural number of layers containing a compound (excluding NbN) which contains at least one kind of an element selected from the group consisting of Ti, Zr, Hf, V, Nb, Ta, Cr, Mo, W, Al, Si, Sr and Y, and at least one kind of an element selected from the group consisting of C, N, O and B.

(6) The coated cutting tool of any of (1) to (4), wherein the coating layer contains an inner layer between the substrate and the outermost layer, the inner layer contains a first laminated structure and a second laminated structure, the first laminated structure contains at least two kinds of layers having different compositions, the two kinds of the layers are alternately laminated twice or more, and an average thickness of the layers contained in the first laminated structure is 60 nm or more and 500 nm or less, the second laminated structure contains at least two kinds of layers having different compositions, the two kinds of the layers are alternately laminated twice or more, and an average thickness of the layers contained in the second laminated structure is 2 nm or more and less than 60 nm, and the layers contained in the first laminated structure and the second laminated structure contain a compound (excluding NbN) which contains at least one kind of a metallic element selected from the group consisting of Ti, Zr, Hf, V, Nb, Ta, Cr, Mo, W, Al, Si, Sr and Y, and at least one kind of a nonmetallic element selected from the group consisting of C, N, O and B.

(7) The coated cutting tool of (6), wherein the first laminated structure and the second laminated structure contained in the inner layer are alternately laminated twice or more continuously.

(8) The coated cutting tool of (6) or (7), wherein an average thickness of the first laminated structure is 0.2 μm or more and 6 μm or less.

(9) The coated cutting tool of any of (6) to (8), wherein an average thickness of the second laminated structure is 0.02 μm or more and 6 μm or less.

(10) The coated cutting tool of any of (5) to (9), wherein an average thickness of the inner layer is 0.22 μm or more and 12 μm or less.

(11) The coated cutting tool of any of (1) to (10), wherein an average thickness of the whole coating layer is 0.5 μm or more and 15 μm or less.

(12) The coated cutting tool of any of (1) to (11), wherein the substrate comprises at least one kind of material selected from the group consisting of a cemented carbide, a cermet, ceramics, a cubic boron nitride sintered body, a diamond sintered body and a high speed steel.

Effects of the Invention

According to the present invention, chipping resistance and fracture resistance of a coated cutting tool can be improved without lowering wear resistance thereof, so that it can accomplish the effect that tool life can be elongated than those of the conventional ones.

BRIEF DESCRIPTION OF THE DRAWING

FIG. 1 is an example of a schematic drawing of a cross-sectional structure of the coated cutting tool of the present invention.

EMBODIMENTS TO CARRY OUT THE INVENTION

The coated cutting tool of the present invention contains a substrate and a coating layer formed onto the surface of the substrate. The substrate in the present invention may be any material so long as it is used as a substrate of the coated cutting tool. The substrate in the present invention is not particularly limited, and it is, for example, a cemented carbide, a cermet, ceramics, a cubic boron nitride sintered body, a diamond sintered body and a high speed steel. Among these, either of a cemented carbide, a cermet, ceramics and a cubic boron nitride sintered body is preferred. This is because a cemented carbide, a cermet, ceramics and a cubic boron nitride sintered body are excellent in wear resistance and fracture resistance.

An average thickness of the whole coating layer in the coated cutting tool of the present invention is preferably 0.5 to 15 μm. If the average thickness of the coating layer is less than 0.5 μm, wear resistance of the coated cutting tool tends to be lowered. If the average thickness of the coating layer exceeds 15 μm, fracture resistance of the coated cutting tool tends to be lowered. The average thickness of the whole the coating layer is further preferably 1.5 to 8.0 μm.

In the coated cutting tool of the present invention, the coating layer contains an outermost layer. The outermost layer contains NbN. The NbN contains cubic NbN and hexagonal NbN. If the outermost layer of the coating layer contains NbN, lubricity of the coating layer is improved. If the ratio of the cubic NbN in the outermost layer becomes high, hardness and wear resistance of the coating layer are lowered. On the other hand, if the ratio of the hexagonal NbN in the outermost layer becomes high, while wear resistance of the coating layer is improved, toughness of the coating layer is lowered.

Therefore, the outermost layer of the coating layer is characterized in that the cubic NbN and the hexagonal NbN are contained. By containing the cubic NbN and the hexagonal NbN in the outermost layer, a coated cutting tool excellent in wear resistance and toughness can be obtained. The outermost layer means a layer formed at the most surface side.

In the coated cutting tool of the present invention, the peak of the NbN in the X-ray diffraction analysis has the following characteristics.

A peak intensity at a (200) plane of the cubic NbN is made $I_c$.

A peak intensity at a (101) plane of the hexagonal NbN is made $I_{h1}$.

Then, a ratio $[I_{h1}/(I_{h1}+I_c)]$ of $I_{h1}$ based on a sum of $I_c$ and $I_{h1}$ is 0.5 or more and less than 1.0.

$$0.5 \leq I_{h1}/(I_{h1}+I_c) < 1.0$$

If $I_{h1}/(I_{h1}+I_c)$ is less than 0.5, the ratio of the hexagonal NbN in the outermost layer is small, so that wear resistance of the coating layer is lowered.

If $I_{h1}/(I_{h1}+I_c)$ is 1.0, and the NbN in the outermost layer comprises the hexagonal NbN alone, toughness of the coating layer is lowered.

Therefore, $I_{h1}/(I_{h1}+I_c)$ is preferably 0.5 or more and less than 1.0.

In the coated cutting tool of the present invention, if the ratio of the hexagonal NbN at the (101) plane is increased, occurrence of cracks which become starting points of chipping or fracture can be suppressed.

In the coated cutting tool of the present invention, the peak of the NbN in the X-ray diffraction analysis has the following characteristics.

A sum of peak intensities at a (103) plane and a (110) plane of the hexagonal NbN is made $I_{h2}$.

A ratio $[I_{h1}/(I_{h1}+I_{h2})]$ of $I_{h1}$ based on a sum of $I_{h1}$ and $I_{h2}$ is 0.5 or more and 1.0 or less.

$$0.5 \leq I_{h1}/(I_{h1}+I_{h2}) < 1.0$$

If $I_{h1}/(I_{h1}+I_{h2})$ is less than 0.5, the ratio of the hexagonal NbN at the (101) plane is small, so that the effect of suppressing occurrence of cracks is lowered, and chipping resistance and fracture resistance of the coated cutting tool are lowered. Therefore, $I_{h1}/(I_{h1}+I_{h2})$ is preferably 0.5 or more and 1.0 or less.

The sum of the peak intensities at the (103) plane and the (110) plane of the hexagonal NbN corresponds to the value in which the peak intensity at the (103) plane and the peak intensity at the (110) plane are summed. According to JCPDS card No. 25-1361, this is because the (103) plane of the hexagonal NbN has a diffraction peak of 2θ existing at around 61.9°, and the (110) plane of the hexagonal NbN has a diffraction peak of 2θ existing at around 62.6°.

If FWHM of the peak at the (101) plane of the NbN of the present invention is 0.2° or more, an average particle size of the NbN becomes small, and wear resistance tends to be improved. However, if FWHM of the peak at the (101) plane of the NbN exceeds 0.6°, an average particle size of the NbN becomes too small, so that the effect of suppressing occurrence of cracks tends to be lowered. Therefore, FWHM of the peak at the (101) plane of the NbN is preferably 0.2° or more and 0.6° or less.

The NbN of the present invention preferably further contains at least one kind of an element selected from the group consisting of Ti, Zr, Hf, V, Ta, Cr, Mo, W, Al, Si, Sr and Y. This is because if the NbN contains either of these elements, wear resistance of the coated cutting tool is improved. If the content of these elements in the NbN exceeds 25 atomic %, lubricity tends to be lowered. Therefore, the content of these elements in the NbN is preferably 25 atomic % or less, and more preferably 10 atomic % or less.

If the average thickness of the outermost layer of the present invention is less than 0.05 μm, wear resistance, chipping resistance and fracture resistance of the NbN are not exhibited for a long period of time, so that a lifetime of the coated cutting tool tends to be shortened. If the average thickness of the outermost layer exceeds 3 μm, fracture resistance of the coated cutting tool tends to be lowered. Thus, the average thickness of the outermost layer is preferably 0.05 μm or more and 3 μm or less.

The coating layer of the present invention may be a monolayer comprising the outermost layer alone. Or else, the coating layer of the present invention may contain an inner layer between the substrate and the outermost layer. The inner layer is not particularly limited so long as it is used as a coating layer of the coated cutting tool. The inner layer is preferably a layer of a compound (excluding NbN) comprising at least one kind of an element selected from the group consisting of Ti, Zr, Hf, V, Nb, Ta, Cr, Mo, W, Al, Si, Sr and Y, and at least one kind of an element selected from the group consisting of C, N, O and B. The inner layer is preferably a monolayer or a plural number of layers containing such a compound. When the inner layer contains such a compound, wear resistance of the coated cutting tool is improved.

The inner layer contained in the coating layer of the present invention preferably contains a specific first laminated structure and second laminated structure. This is because when the inner layer contains the first laminated structure and the second laminated structure, wear resistance and fracture resistance of the coating layer is improved. Each layer constituting the first laminated structure and the second laminated structure contains a compound (excluding NbN) comprising at least one kind of a metallic element selected from the group consisting of Ti, Zr, Hf, V, Nb, Ta, Cr, Mo, W, Al, Si, Sr and Y, and at least one kind of a nonmetallic element selected from the group consisting of C, N, O and B. Therefore, the coating layer is excellent in wear resistance.

The layers contained in the first laminated structure and the second laminated structure further preferably contain a compound comprising at least two kinds of metallic elements selected from the group consisting of Ti, Nb, Ta, Cr, W, Al, Si and Y, and at least one kind of a nonmetallic element selected from the group consisting of C, N, O and B. This is because such a compound has a property of hard. The compound contained in the layer constituting the first laminated structure may be, specifically, $(Al_{0.50}Ti_{0.50})N$, $(Al_{0.60}Ti_{0.40})N$, $(Al_{0.67}Ti_{0.33})N$, $(Al_{0.67}Ti_{0.33})CN$, $(Al_{0.45}Ti_{0.45}Si_{0.10})N$, $(Al_{0.45}Ti_{0.45}Y_{0.10})N$, $(Al_{0.50}Ti_{0.30}Cr_{0.20})N$, $(Al_{0.50}Ti_{0.45}Nb_{0.05})N$, $(Al_{0.50}Ti_{0.45}Ta_{0.05})N$, $(Al_{0.50}Ti_{0.45}W_{0.05})N$, $(Ti_{0.90}Si_{0.10})N$, $(Al_{0.50}Cr_{0.50})N$, etc.

The metallic element contained in the layer constituting the first laminated structure is preferably the same metallic element as in the other layer(s) constituting the first laminated structure. That is, a plural number of the layers constituting the first laminated structure are preferably constituted by the same kinds of the metallic elements. Further, it is preferred that an absolute value of the difference between a ratio of the specific metallic element contained in a layer constituting the first laminated structure, and a ratio of the specific metallic element contained in the other layer constituting the first laminated structure which is adjacent thereto is 5 atomic % or more. "A ratio of the specific metallic element" herein mentioned means a ratio of the specific metallic element (atomic %) contained in the layer based on the whole metallic elements contained in the layer.

When the first laminated structure employs such a constitution, crystal lattice becomes inconsistent at the boundary surface between the layers without lowering adhesiveness between a layer constituting the first laminated structure and a layer adjacent to the layer. Therefore, cracks are likely propagated to the direction parallel to the boundary surface of the layers constituting the first laminated structure, whereby propagation of the cracks to the substrate can be effectively suppressed.

With regard to the above-mentioned "absolute value of the difference between a ratio of the specific metallic elements contained in a layer and a ratio of the specific metallic elements contained in the other layers adjacent to the above layer is 5 atomic % or more", it is explained in more detail.

When the first laminated structure is constituted by, for example, an $(Al_{0.55}Ti_{0.45})N$ layer and an $(Al_{0.67}Ti_{0.33})N$ layer, the kinds of the metallic elements contained in the two layers are the same. This is because the two layers both contain Al and Ti. In this case, an amount of the Al element contained in the $(Al_{0.55}Ti_{0.45})N$ layer is 55 atomic % based on the whole metallic elements. The amount of the Al element contained in the $(Al_{0.67}Ti_{0.33})N$ layer is 67 atomic % based on the whole metallic elements. The difference in the ratios of the amounts of the Al element in these two layers is 12 atomic %. Accordingly, in this case, the above-mentioned condition that "the absolute value in the difference is 5 atomic % or more" is satisfied.

When the first laminated structure is constituted by, for example, an $(Al_{0.49}Ti_{0.39}Cr_{0.12})N$ layer and an $(Al_{0.56}Ti_{0.36}Cr_{0.08})N$ layer, the kinds of the metallic elements contained in the two layers are the same. This is because the two layers both contain Al, Ti and Cr. In this case, the difference in the ratios of the amounts of the Ti element contained in the two layers is 3 atomic %. The difference in the ratios of the amounts of the Cr element contained in the two layers is 4 atomic %. These values are each less than 5 atomic %. However, even in this case, the difference in the ratios of the amounts of the Al element contained in the two layers is 7 atomic %, so that the above-mentioned condition that "an absolute value of the difference is 5 atomic % or more" is satisfied.

Incidentally, in the present specification, when the nitride is shown as $(M_aL_b)N$, it means that an atomic ratio of the M element based on the whole metallic elements is a, and an atomic ratio of the L element based on the whole metallic elements is b. For example, $(Al_{0.55}Ti_{0.45})N$ means that an atomic ratio of the Al element based on the whole metallic elements is 0.55, and an atomic ratio of the Ti element based on the whole metallic elements is 0.45. That is, $(Al_{0.55}Ti_{0.45})N$ shows that an amount of the Al element based on the whole metallic element is 55 atomic %, and an amount of the Ti element based on the whole metallic element is 45 atomic %.

The metallic element(s) contained in the layers constituting the second laminated structure is/are preferably the same as the metallic element(s) contained in the other layers constituting the second laminated structure. That is, a plurality of the layers constituting the second laminated structure are preferably constituted by the same kinds of the metallic elements. In addition, it is preferred that an absolute value of the difference between a ratio of the specific metallic elements contained in the layers constituting the second laminated structure and a ratio of the specific metallic elements contained in the other layers constituting the second laminated structure adjacent to the above layer is 5 atomic % or more. "A ratio of the specific metallic elements" herein mentioned means a ratio (atomic %) of the number of the atoms of the specific metallic elements contained in the layer based on the number of atoms of the whole metallic elements contained in the layer.

If the second laminated structure employs such a constitution, crystal lattice becomes inconsistent at the boundary surface between the layers without lowering adhesiveness between a layer constituting the second laminated structure and a layer adjacent to the layer. Therefore, cracks are likely propagated to the direction parallel to the boundary surface of the layers constituting the second laminated structure, whereby propagation of the cracks to the substrate can be effectively suppressed. The meaning of the above-mentioned "absolute value of the difference between a ratio of the specific metallic elements contained in a layer and a ratio of the specific metallic elements contained in the other layers adjacent to the above layer is 5 atomic % or more" is the same as those explained in the above first laminated structure.

As the other embodiments of the coated cutting tool of the present invention, it is preferred that one or more kinds of the metallic elements contained in the layer constituting the first laminated structure are different from the metallic elements contained in the other layers constituting the first laminated structure adjacent to the above layer. If one or more kinds of the metallic elements is/are different, crystal lattice becomes inconsistent at the boundary surface between the layers, and cracks are likely propagated to the direction parallel to the boundary surface of the layers, whereby propagation of the cracks to the substrate can be effectively suppressed.

When the first laminated structure is constituted by, for example, an $(Al_{0.50}Ti_{0.50})N$ layer and an $(Al_{0.50}Ti_{0.30}Cr_{0.20})N$ layer, and the metallic elements contained in the two layers are compared to each other, the above condition is satisfied. This is because the two layers contain Al and Ti, but Cr is contained in one layer alone.

When the first laminated structure is constituted by, for example, an $(Al_{0.50}Cr_{0.50})N$ layer and an $(Al_{0.67}Ti_{0.33})N$ layer, and the metallic elements contained in the two layers are compared to each other, the above condition is satisfied. This is because the two layers contain Al, but Cr and Ti are contained in one layer alone.

Similarly, in the coated cutting tool of the present invention, it is preferred that one or more kinds of the metallic elements contained in the layer constituting the second laminated structure are different from the metallic elements contained in the other layers constituting the second laminated structure adjacent to the above layer. If one or more kinds of the metallic elements is/are different, crystal lattice becomes inconsistent at the boundary surface between the layers, and cracks are likely propagated to the direction parallel to the boundary surface of the layers, whereby propagation of the cracks to the substrate can be effectively suppressed.

The coated cutting tool of the present invention contains a coating layer. The coating layer contains a first laminated structure. The first laminated structure contains two or more layers comprising the above-mentioned compound. The average thickness of the respective layers contained in the first laminated structure is 60 nm or more and 500 nm or less. Two or more layers contained in the first laminated structure are periodically laminated. The periodically laminated structure contains at least two kinds of layers having different compositions. These two kinds of layers are preferably laminated alternately twice or more. When two kinds of layers having different compositions are laminated alternately twice or more, propagation of the cracks is suppressed, so that fracture resistance of the coated cutting tool is further improved.

In the present invention, the minimum unit of the thickness in which lamination of the layers is repeated is called as a "laminating cycle".

FIG. 1 is an example of a schematic drawing of a cross-sectional structure of the coated cutting tool of the present invention. In the following, the laminating cycle is explained by referring to FIG. 1.

For example, Layer A1 (6a), Layer B1 (6b), Layer C1 and Layer D1 which have different compositions are repeatedly laminated from the substrate (1) toward the surface of the coating layer (2). More specifically, these layers are repeatedly laminated in the order of Layer A1 (6a)→Layer B1 (6b)→Layer C1→Layer D1→Layer A1 (6a)→Layer B1 (6b)→Layer C1→Layer D1→ . . . . In this case, the total thickness from Layer A1 (6a) to Layer D1 is a "laminating cycle".

For example, Layer A1 (6a) and Layer B1 (6b) which have different compositions are repeatedly laminated from the substrate (1) toward the surface of the coating layer (2). More specifically, these layers are laminated in the order of Layer A1 (6a)→Layer B1 (6b)→Layer A1 (6a)→Layer B1 (6b)→Layer A1 (6a)→Layer B1 (6b)→ . . . . In this case, the total of the thickness of Layer A1 (6a) and the thickness of Layer B1 (6b) is a "laminating cycle".

To form the first laminated structure, at least two kinds of layers having different compositions are periodically laminated. The average thickness of the respective layers is 60 nm or more and 500 nm or less. By being formed the first laminated structure as mentioned above, the following effects can be obtained.

Cracks generated at the surface of the coating layer during the use of the coated cutting tool reach to the first laminated structure. The cracks reach to the first laminated structure and propagate to the direction parallel to the boundary surface of the layers having different compositions. Accordingly, an effect of preventing the cracks from propagating to the substrate can be obtained. Such an effect can be more heightened by alternately laminating two layers having different compositions twice or more. More specifically, it is preferred that Layer A1 (6a) and Layer B1 (6b) having different compositions are alternately laminated twice or more from the substrate toward the surface of the coating layer. That is, the first laminated structure preferably contains an alternately laminated structure of Layer A1 (6a)→Layer B1 (6b)→Layer A1 (6a)→Layer B1 (6b)→ . . . .

If the average thickness of the respective layers contained in the first laminated structure is less than 60 nm, propagation of the cracks to the substrate cannot sufficiently be prevented. On the other hand, if the average thickness of the respective layers exceeds 500 nm, fracture resistance of the coated cutting tool is lowered. Therefore, the average thickness of the respective layers contained in the first laminated structure is preferably 60 nm or more and 500 nm or less. The average thickness of the respective layers contained in the first laminated structure is more preferably 60 nm or more and 250 nm or less.

If the average thickness of the first laminated structure is less than 0.2 μm, a number (a number of repeated times) of periodically laminating the layers having different compositions becomes small. In this case, the effect of suppressing propagation of cracks to the substrate is lowered. On the other hand, if the average thickness of the first laminated structure exceeds 6 μm, residual compressive stress of the whole coating layer becomes high. As a result, peeling or fracture of the coating layer is likely generated, whereby fracture resistance of the coated cutting tool is lowered. Accordingly, the average thickness of the first laminated structure is preferably 0.2 μm or more and 6 μm or less.

The coated cutting tool of the present invention contains a coating layer. The coating layer contains a second laminated structure. The second laminated structure contains two or more layers comprising the above-mentioned metal(s) or compound(s). The average thickness of the respective layers contained in the second laminated structure is 2 nm or more and less than 60 nm. Two or more layers contained in the second laminated structure are periodically laminated. The periodically laminated structure contains at least two kinds of layers having different compositions. These two kinds of layers are preferably laminated alternately twice or more. When two kinds of layers having different compositions are laminated alternately twice or more, hardness of the second laminated structure becomes high, so that wear resistance of the coated cutting tool is further improved.

In the second laminated structure, the minimum unit of the thickness in which lamination of the layers is repeated is also called as a "laminating cycle".

For example, in FIG. 1, Layer A2 (7a), Layer B2 (7b), Layer C2 and Layer D2 which have different compositions are repeatedly laminated from the substrate (1) toward the surface of the coating layer (2). More specifically, these layers are laminated in the order of Layer A2 (7a)→Layer B2 (7b)→Layer C2→Layer D2→Layer A2 (7a)→Layer B2 (7b)→Layer C2→Layer D2→ . . . . In this case, the total thickness from Layer A2 (7a) to Layer D2 is a "laminating cycle".

For example, Layer A2 (7a) and Layer B2 (7b) which have different compositions are repeatedly laminated from the substrate (1) toward the surface of the coating layer (2). More specifically, these layers are laminated in the order of Layer A2 (7a)→Layer B2 (7b)→Layer A2 (7a)→Layer B2 (7b)→Layer A2 (7a)→Layer B2 (7b)→ . . . . In this case, total of the thickness of Layer A2 (7a) and the thickness of Layer B2 (7b) is a "laminating cycle".

To form the second laminated structure, at least two kinds of layers having different compositions are periodically laminated. The average thickness of the respective layers is 2 nm or more and less than 60 nm. By the second laminated structure being thus formed, an effect that hardness of the second laminated structure becomes high whereby wear resistance of the coated cutting tool is improved can be obtained. Such an effect can be more heightened by alternately laminating two layers having different compositions twice or more. More specifically, it is preferred that Layer A2 (7a) and Layer B2 (7b) having different compositions are alternately laminated twice or more from the substrate toward the surface of the coating layer. That is, the second laminated structure preferably contains an alternately laminated structure of Layer A2 (7a)→Layer B2 (7b)→Layer A2 (7a)→Layer B2 (7b)→ . . . .

If the average thickness of the respective layers contained in the second laminated structure is less than 2 nm, it is difficult to form a layer having a uniform thickness. If the average thickness of the respective layers contained in the second laminated structure is 60 nm or more, hardness of the second laminated structure is lowered, so that wear resistance of the coated cutting tool is lowered. Further, in this case, difference between the thickness of the second laminated structure and the thickness of the first laminated structure becomes small. As a result, an effect of suppressing propagation of the cracks to the substrate, which is caused by generating propagation of cracks to the direction parallel to the boundary surface of the first laminated structure and the second laminated structure, cannot sufficiently be obtained. Therefore, the average thickness of the respective layers contained in the second laminated structure is preferably 2 nm or more and less than 60 nm. The average thickness of the respective layers contained in the second laminated structure is further preferably 5 nm or more and 30 nm or less.

If the average thickness of the second laminated structure is less than 0.02 μm, a number (a number of repeated times) of periodically laminating the layers having different compositions becomes small. In this case, the effect of improving hardness of the second laminated structure cannot be obtained. On the other hand, if the average thickness of the second laminated structure exceeds 6 μm, residual compressive stress of the second laminated structure becomes high. As a result, peeling or fracture of the coating layer is likely generated, whereby fracture resistance of the coated cutting tool is lowered. Accordingly, the average thickness of the second laminated structure is preferably 0.02 μm or more and 6 μm or less.

The coated cutting tool of the present invention contains a coating layer. The coating layer contains an outermost layer. The coating layer may contain an inner layer formed between the substrate and the outermost layer. That is, the inner layer may be formed onto the surface of the substrate, and the outermost layer may be formed onto the surface of the inner layer. In this case, the coating layer is constituted by the inner layer and the outermost layer. The inner layer may contain the first laminated structure excellent in fracture resistance, and the second laminated structure excellent in wear resistance. According to this constitution, the coated cutting tool of the present invention is excellent in fracture resistance and wear resistance.

The first laminated structure and the second laminated structure are preferably so laminated that these structures are provided alternately two or more continuously. If the first laminated structure and the second laminated structure are alternately laminated, cracks are likely propagated to the direction parallel to the boundary surface of the first laminated structure and the second laminated structure. As a result, propagation of the cracks to the substrate can be suppressed, whereby fracture resistance of the coated cutting tool is improved.

Positional relationship of the first laminated structure and the second laminated structure is not particularly limited. The positional relationship of the first laminated structure and the second laminated structure are, for example, any of the following (1) to (4).
(1) The first laminated structure is closest to the substrate, and the second laminated structure is closest to the surface of the inner layer.
(2) The second laminated structure is closest to the substrate, and the first laminated structure is closest to the surface of the inner layer.
(3) The first laminated structure is closest to the substrate, and is closest to the surface of the inner layer.
(4) The second laminated structure is closest to the substrate, and is closest to the surface of the inner layer.

In the above-mentioned (1) to (4), "the surface of the inner layer" means a surface of the inner layer at the side opposite to the substrate.

Among the above-mentioned positional relationships, (1) is preferred. This is because, when the positional relationship of the first laminated structure and the second laminated structure is the above-mentioned (1), residual compressive stress of the first laminated structure is lower than residual compressive stress of the second laminated structure, so that peeling resistance of the coating layer tends to be improved.

If the average thickness of the inner layer is less than 0.22 μm, wear resistance of the coated cutting tool tends to be lowered. If the average thickness of the inner layer exceeds 12 μm, fracture resistance of the coated cutting tool tends to be lowered. Accordingly, the average thickness of the inner layer is preferably 0.22 μm or more and 12 μm or less. The average thickness of the inner layer is further preferably 1.5 μm or more and 8 μm or less.

A process for preparing the coating layer in the coated cutting tool of the present invention is not particularly limited. For example, the coating layer can be prepared by the physical vapor deposition method such as the ion plating method, the arc ion plating method, the sputtering method and the ion mixing method, etc. In particular, the coating layer formed by the arc ion plating method has high adhesiveness to the substrate. Accordingly, among these methods, the arc ion plating method is preferred.

The process for preparing the coated cutting tool of the present invention is explained by referring to specific examples. Incidentally, the process for preparing the coated cutting tool of the present invention is not particularly limited so long as it can accomplish the constitution of the coated cutting tool.

A substrate processed to a tool shape is charged in a reaction vessel of a physical vapor deposition device. Next, inside of the reaction vessel is evacuated until a pressure becomes $1 \times 10^{-2}$ Pa or lower. After evacuation, the substrate is heated to 200 to 800° C. by a heater in the reaction vessel. After heating, an Ar gas is introduced into the reaction vessel, and the pressure is made 0.5 to 5.0 Pa. Under the Ar gas atmosphere with the pressure of 0.5 to 5.0 Pa, a bias voltage with −200 to −1,000V is applied to the substrate. A current with 5 to 20 A is passed through the tungsten filament in the reaction vessel. The surface of the substrate is subjected to an ion bombardment treatment by an Ar gas. After the surface of the substrate is subjected to the ion bombardment treatment, the reaction vessel is evacuated so that a pressure inside thereof becomes $1 \times 10^{-2}$ Pa or lower.

When an inner layer is to be formed between the substrate and the outermost layer containing NbN, after the ion bombardment treatment and evacuation, a reaction gas such as a nitrogen gas, etc., is introduced into the reaction vessel. The pressure in the reaction vessel is made 0.5 to 5.0 Pa, and a bias voltage with −10 to −150V is applied to the substrate. By evaporating the metal evaporation sources depending on the metal components of the respective layers by an arc discharge, the respective layers can be formed onto the surface of the substrate. Incidentally, two or more kinds of metal evaporation sources placed in a position apart from each other are simultaneously evaporated by an arc discharge, and the table onto which a substrate has been fixed is rotated to form a layer constituting the first laminated structure or the second laminated structure. In this case, by adjusting a rotation number of the table onto which the substrate has been fixed in the reaction vessel, the thicknesses of the respective layers constituting the first laminated structure or the second laminated structure can be controlled. By alternately evaporating two or more kinds of metal evaporation sources by an arc discharge, a layer constituting the first laminated structure or the second laminated structure can be also formed. In this case, by adjusting arc discharge times of the metal evaporation sources respectively, the thicknesses of the respective layers constituting the first laminated structure or the second laminated structure can be controlled.

When an outermost layer containing NbN of the present invention is to be formed, after the ion bombardment treatment, or after forming the inner layer, inside of the reaction vessel is evacuated and a temperature of the substrate is raised to 400° C. to 600° C. Thereafter, a nitrogen gas and an Ar gas are introduced into the reaction vessel with a ratio of 1:1. According to this procedure, the pressure at the inside of the reaction vessel is made 2.0 to 5.0 Pa, and a bias voltage with −10 to −30V is applied to the substrate. By evaporating the metal evaporation source comprising Nb by an arc discharge with an arc current of 160 to 180 A, the outermost layer can be formed onto the surface of the substrate or the surface of the inner layer. If an atmosphere in the reaction vessel is made a mixed gas atmosphere of a nitrogen gas and an Ar gas, the arc discharge becomes stable, so that orientation of the hexagonal NbN can be easily controlled. If the bias voltage becomes higher than −40V, a ratio of the (103) plane and the (110) plane of the hexagonal NbN becomes high, so that a ratio of $I_{h1}$ based on the sum of $I_{h1}$ and $I_{h2}$ becomes smaller than 0.5. In addition, if the arc current becomes lower than 150A, a ratio of the cubic NbN becomes high, so that a ratio of $I_{h1}$ based on the sum of $I_c$ and $I_{h1}$ becomes small. If the atmosphere in the reaction vessel is a nitrogen atmosphere, a ratio of the (103) plane and the (110) plane of the hexagonal NbN becomes high, so that a ratio of $I_{h1}$ based on the sum of $I_{h1}$ and $I_{h2}$ becomes smaller than 0.5. Incidentally, FWHM depends on a temperature at the time of forming the coating layer, and becomes large as the temperature is higher.

The thicknesses of the respective layers constituting the coating layer can be measured by observing the cross-sectional structure of the coated cutting tool. For example, the thicknesses of the respective layers constituting the coating layer can be measured by using optical microscope, scanning electron microscope (SEM), transmission electron microscope (TEM), etc.

The average thicknesses of the respective layers constituting the coating layer can be obtained as follows.

At the position nearer to 50 μm from the blade edge of the surface opposed to the metal evaporation sources toward the center portion of said surface, the cross-sectional surface of the coated cutting tool is observed at the three points or more. From the observed cross-sectional surfaces, thicknesses of the respective layers and thicknesses of the respective laminated structures are measured. By calculating the average value of the measured thicknesses, the average thickness can be obtained.

The compositions of the respective layers constituting the coating layer can be measured from the cross-sectional structure of the coated cutting tool by using an energy dispersive X-ray spectrometer (EDS) or a wavelength dispersive X-ray analyzer (WDS), etc.

With regard to the outermost layer of the present invention, the peak intensity $I_c$ at the (200) plane of the cubic NbN, the peak intensity $I_{h1}$ of the (101) plane of the hexagonal NbN and the sum of the peak intensities $I_{h2}$ of the (103) plane and the (110) plane of the hexagonal NbN can be measured by using a commercially available X-ray diffractometer. For the measurement of the intensities $I_c$, $I_{h1}$ and $I_{h2}$, for example, an X-ray diffractometer RINT TTRIII manufactured by Rigaku Corporation can be used. Also, for the measurement, X-ray diffraction measurement of a 2θ/θ concentrated optical system using a Cu-Kα line can be used. The measurement conditions of the X-ray diffraction are, for example, as follows.

Output: 50 kV, 250 mA,
Solar slit at incident side: 5°,
Divergence vertical slit: 2/3°,
Divergence vertical limit slit: 5 mm,
Scattering slit 2/3°,
Solar slit at photoreception side: 5°,
Photoreception slit: 0.3 mm,
BENT monochromator,
Photoreception monochrome slit: 0.8 mm,
Sampling width: 0.01°,
Scanning speed: 4°/min,
2θ measurement range: 30 to 70°

When the above-mentioned respective peak intensities are obtained from the X-ray diffraction chart, an analysis software attached to the X-ray diffractometer may be used. When the analysis software is used, background processing and Kα2 peak removal are carried out by using a cubic approximation, and profile fitting is carried out by using a Pearson-VII function. According to this procedure, the respective peak intensities can be obtained.

Incidentally, when the inner layer is formed nearer to the substrate side than the outermost layer, the respective peak intensities can be measured by the thin film X-ray diffraction method so as to be not affected by the inner layer.

With regard to the outermost layer of the present invention, FWHM of the peak at the (101) plane of the hexagonal NbN can be measured by using a commercially available X-ray diffractometer. For the measurement of FWHM of the peak at the (101) plane of the hexagonal NbN, for example, an X-ray diffractometer RINT TTRIII manufactured by Rigaku Corporation can be used. Also, for the measurement, X-ray diffraction measurement of a 2θ/θ concentrated optical system using a Cu-Kα line can be used. The measurement conditions of the X-ray diffraction are, for example, as follows.

Output: 50 kV, 250 mA,
Solar slit at incident side: 5°,
Divergence vertical slit: 2/3°,
Divergence vertical limit slit: 5 mm,
Scattering slit 2/3°,
Solar slit at photoreception side: 5°,
Photoreception slit: 0.3 mm,
BENT monochromator,
Photoreception monochrome slit: 0.8 mm,
Sampling width: 0.01°,
Scanning speed: 4°/min,
2θ measurement range: 30 to 70°

Incidentally, when the inner layer is formed nearer to the substrate side than the outermost layer, the FWHM of the peak at the (101) plane of the hexagonal NbN can be measured by the thin film X-ray diffraction method so as to be not affected by the inner layer.

Specific examples of coated cutting tool of the present invention are a cutting edge replaceable cutting insert for milling or turning, a drill and an end mill.

Example 1

As a substrate, the following two kinds of inserts were prepared.

An insert having an ISO standard CNGA120408 shape made of a cubic boron nitride sintered body with a composition of 70% cBN-20% TiN-5% $Al_2O_3$-5% $TiB_2$ (volume %)

An insert having an ISO standard ASMT11T304PDPR shape corresponding to S10 and made of a cemented carbide In the reaction vessel of an arc ion plating device, metal evaporation sources which became the compositions of the respective layers shown in Table 1 and Table 2 were arranged. The prepared substrate was fixed to a fixing metal fitting of a rotary table in the reaction vessel.

Thereafter, inside of the reaction vessel was evacuated until the pressure therein became $5.0 \times 10^{-3}$ Pa or lower. After evacuation, the substrate was heated by a heater in the reaction vessel until the temperature thereof became 500° C. After heating, an Ar gas was introduced into the reaction vessel so that the pressure in the reaction vessel became 5.0 Pa.

At an Ar gas atmosphere with a pressure of 5.0 Pa, a bias voltage with −1,000V was applied to the substrate. A current of 10 A was passed through the tungsten filament in the reaction vessel. Under such conditions, the ion bombardment treatment by an Ar gas was carried out for 30 minutes to the surface of the substrate. After completion of the ion bombardment treatment, inside of the reaction vessel was evacuated until the pressure in the reaction vessel became $5.0 \times 10^{-3}$ Pa or lower.

With regard to the present products 1 to 5 and the comparative products 1 to 5, after evacuation, a nitrogen gas was introduced into the reaction vessel, and inside of the reaction vessel was made a nitrogen gas atmosphere with a pressure of 2.7 Pa. A bias voltage with −50V was applied to the substrate. The inner layer was formed by evaporating the metal evaporation sources by an arc discharge with an arc current of 200 A.

With regard to the present product 6, after evacuation, a nitrogen gas ($N_2$) and a methane gas ($CH_4$) were introduced into the reaction vessel so that a partial pressure ratio became $N_2:CH_4=1:1$, whereby inside of the reaction vessel was made a mixed gas atmosphere with a pressure of 2.7 Pa. A bias voltage with −50V was applied to the substrate. The inner layer was formed by evaporating the metal evaporation sources by an arc discharge with an arc current of 200 A.

With regard to the present product 7 and the comparative products 6 in which thicknesses of the respective layers of the inner layer were large, after evacuation, metal evaporation sources of Layer X and metal evaporation sources of Layer Y were alternately evaporated by arc discharge to form Layer X and Layer Y. At this time, the thickness of Layer X and the thickness of Layer Y were controlled by adjusting arc discharge times when the respective layers were formed.

With regard to the present product 8 and the comparative product 7 in which thicknesses of the respective layers of the inner layer were small, after evacuation, metal evaporation sources of Layer X and metal evaporation sources of Layer Y were simultaneously evaporated by arc discharge to form Layer X and Layer Y. At this time, the thickness of Layer X and the thickness of Layer Y were controlled by adjusting a rotation number of the rotary table within the range of 0.2 to 10 $min^{-1}$.

With regard to the present products 1 to 8 and the comparative products 3 to 5, after forming the inner layer, the reaction vessel was evacuated until the pressure therein became $5.0 \times 10^{-3}$ Pa or less, and the substrate was heated to a temperature shown in Table 3. Thereafter, a nitrogen gas and an Ar gas were introduced into the reaction vessel with a ratio of 1:1, and the pressure in the reaction vessel was made 3.0 Pa, so that the outermost layer was formed under the conditions shown in Table 3.

With regard to the comparative products 1, 2, 6 and 7, after forming the inner layer, the substrate was heated to a temperature shown in Table 3. Thereafter, the outermost layer was formed under the conditions shown in Table 3.

Each layer was formed onto the surface of the substrate until it became the predetermined thickness shown in Table 1 and Table 2. Thereafter, a power of the heater was turned off, and after the temperature of the sample became 100° C. or lower, the sample was taken out from the reaction vessel.

TABLE 1

| | Coating layer | | | | Average thickness of whole coating layer (μm) |
|---|---|---|---|---|---|
| | Inner layer | | Outermost layer | | |
| Sample No. | Composition | Average thickness (μm) | Composition | Average thickness (μm) | |
| Present product 1 | $(Ti_{0.50}Al_{0.50})N$ | 1.5 | NbN | 0.3 | 1.8 |
| Present product 2 | $(Ti_{0.50}Al_{0.50})N$ | 3 | NbN | 1 | 4 |
| Present product 3 | $(Ti_{0.50}Al_{0.50})N$ | 3 | NbN | 1 | 4 |
| Present product 4 | $(Al_{0.50}Cr_{0.50})N$ | 3 | NbN | 1 | 4 |
| Present product 5 | $(Ti_{0.40}Al_{0.40}Si_{0.20})N$ | 10 | NbN | 2 | 12 |
| Present product 6 | $(Ti_{0.50}Al_{0.50})CN$ | 12 | NbN | 3 | 15 |
| Comparative product 1 | $(Ti_{0.50}Al_{0.50})N$ | 2 | $(Al_{0.60}Ti_{0.40})N$ | 0.3 | 2.3 |
| Comparative product 2 | $(Ti_{0.50}Al_{0.50})N$ | 3 | $(Al_{0.50}Cr_{0.50})N$ | 1 | 4 |
| Comparative product 3 | $(Ti_{0.50}Al_{0.50})N$ | 3 | NbN | 1 | 4 |
| Comparative product 4 | $(Ti_{0.50}Al_{0.50})N$ | 3 | NbN | 1 | 4 |
| Comparative product 5 | $(Ti_{0.50}Al_{0.50})N$ | 3 | NbN | 1 | 4 |

TABLE 2

| | Coating layer | | | | | | | | |
|---|---|---|---|---|---|---|---|---|---|
| | Inner layer (alternately laminated layer) | | | | | | Outermost layer | | |
| | Composition | | Average thickness | | Number (times) of repeated times of Layer X and Layer Y | Average thickness (μm) | | Average thickness (μm) | Average thickness of whole coating layer (μm) |
| Sample No. | LAYER X | LAYER Y | LAYER X (nm) | LAYER Y (nm) | | | Composition | | |
| Present product 7 | $(Ti_{0.50}Al_{0.50})N$ | $(Ti_{0.67}Al_{0.33})N$ | 100 | 100 | 15 | 3 | NbN | 1 | 4 |
| Present product 8 | $(Ti_{0.50}Al_{0.50})N$ | $(Al_{0.50}Cr_{0.50})N$ | 10 | 10 | 150 | 3 | NbN | 1.5 | 4.5 |

TABLE 2-continued

| | Coating layer | | | | | | | |
| | Inner layer (alternately laminated layer) | | | | | Outermost layer | | |
| | Composition | | Average thickness | | Number (times) of repeated times of Layer X and | Average thickness | | Average thickness | Average thickness of whole coating |
| Sample No. | LAYER X | LAYER Y | LAYER X (nm) | LAYER Y (nm) | Layer Y | (μm) | Composition | (μm) | layer (μm) |
|---|---|---|---|---|---|---|---|---|---|
| Comparative product 6 | $(Ti_{0.50}Al_{0.50})N$ | $(Ti_{0.67}Al_{0.33})N$ | 100 | 100 | 15 | 3 | $(Al_{0.60}Ti_{0.40})N$ | 0.3 | 3.3 |
| Comparative product 7 | $(Ti_{0.50}Al_{0.50})N$ | $(Al_{0.50}Cr_{0.50})N$ | 10 | 10 | 150 | 3 | $(Ti_{0.90}Si_{0.10})N$ | 1.5 | 4.5 |

TABLE 3

| Sample No. | Substrate temperature (° C.) | Bias voltage (V) | Arc current (A) |
|---|---|---|---|
| Present product 1 | 500 | −15 | 160 |
| Present product 2 | 500 | −20 | 180 |
| Present product 3 | 600 | −30 | 165 |
| Present product 4 | 400 | −10 | 170 |
| Present product 5 | 500 | −20 | 165 |
| Present product 6 | 650 | −20 | 165 |
| Present product 7 | 500 | −15 | 175 |
| Present product 8 | 600 | −25 | 165 |
| Comparative product 1 | 500 | −40 | 120 |
| Comparative product 2 | 500 | −40 | 120 |
| Comparative product 3 | 500 | −60 | 40 |
| Comparative product 4 | 650 | −25 | 150 |
| Comparative product 5 | 700 | −55 | 165 |
| Comparative product 6 | 500 | −40 | 120 |
| Comparative product 7 | 600 | −60 | 100 |

The average thicknesses of the respective layers of obtained samples were measured as follows.

Cross-sectional surfaces at the three points were observed by TEM at the neighbor of the position of 50 μm from the blade edge at the surface opposed to the metal evaporation sources of the coated cutting tool toward the center portion of said surface. The thicknesses of the respective layers were measured, and an average value of the measured thicknesses was calculated.

The compositions of the respective layers of the obtained samples were measured as follows.

The compositions were measured by using EDS at the cross-sectional surface at the position of 50 μm from the blade edge at the surface opposed to the metal evaporation sources of the coated cutting tool toward the center portion of said surface.

These measured results are also shown in Tables 1 and 2.

Incidentally, compositional ratios of metallic elements of the respective layers in Tables 1 and 2 show an atomic ratio of the respective metallic elements based on the whole metallic elements in the metal compounds constituting the respective layers.

With regard to the obtained samples, thin film X-ray diffraction measurement of a 2θ/θ concentrated optical system using a Cu-Kα line was carried out. The measurement conditions are as follows.

Output: 50 kV, 250 mA,
Solar slit at incident side: 5°,
Divergence vertical slit: 2/3°,
Divergence vertical limit slit: 5 mm,
Scattering slit 2/3°,
Solar slit at photoreception side: 5°,
Photoreception slit: 0.3 mm,
BENT monochromator,
Photoreception monochrome slit: 0.8 mm,
Sampling width: 0.01°,
Scanning speed: 4°/min,
2θ measurement range: 30 to 70°

From the X-ray diffraction chart obtained by the thin film X-ray diffraction measurement, the peak intensity $I_c$ at the (200) plane of the cubic NbN, and the peak intensity $I_{h1}$ at the (101) plane of the hexagonal NbN were obtained. In addition, a ratio $[I_{h1}/(I_{h1}+I_c)]$ of $I_{h1}$ based on the sum of $I_c$ and $I_{h1}$ was obtained. The results are shown in Table 4.

From the X-ray diffraction chart, the sum $I_{h2}$ of the peak intensities at the (103) plane and the (110) plane of the hexagonal NbN was further obtained. In addition, a ratio $[I_{h1}/(I_{h1}+I_{h2})]$ of $I_{h1}$ based on the sum of $I_{h1}$ and $I_{h2}$ was obtained. The results are shown in Table 4.

From the X-ray diffraction chart, FWHM at the (101) plane of the hexagonal NbN was further obtained. The results are shown in Table 4.

TABLE 4

| Sample No. | $I_{h1}/(I_{h1} + I_c)$ | $I_{h1}/(I_{h1} + I_{h2})$ | FWHM (°) |
|---|---|---|---|
| Present product 1 | 0.52 | 0.82 | 0.40 |
| Present product 2 | 0.96 | 0.75 | 0.38 |
| Present product 3 | 0.64 | 0.51 | 0.58 |
| Present product 4 | 0.77 | 0.97 | 0.22 |
| Present product 5 | 0.68 | 0.72 | 0.42 |
| Present product 6 | 0.59 | 0.66 | 0.65 |
| Present product 7 | 0.81 | 0.79 | 0.36 |
| Present product 8 | 0.64 | 0.59 | 0.55 |
| Comparative product 1 | — | — | — |
| Comparative product 2 | — | — | — |
| Comparative product 3 | Cubic alone | — | — |
| Comparative product 4 | 0.46 | 0.6 | 0.63 |
| Comparative product 5 | 0.63 | 0.17 | 0.77 |

TABLE 4-continued

| Sample No. | $I_{h1}/(I_{h1} + I_c)$ | $I_{h1}/(I_{h1} + I_{h2})$ | FWHM (°) |
|---|---|---|---|
| Comparative product 6 | — | — | — |
| Comparative product 7 | — | — | — |

The following Cutting test 1 and Cutting test 2 were carried out by using the obtained samples, and fracture resistance and wear resistance were evaluated. The evaluation results are shown in Table 5.

[Cutting Test 1 Fracture Resistance Test]
Insert: Cubic boron nitride sintered body, CNGA120408,
Work piece material: SCM420H,
Shape of work piece material: a disk with φ200 mm×50 mm, (four grooves are formed.)
Cutting speed: 100 m/min,
Feed: 0.2 mm/rev,
Depth of cut: 0.2 mm,
Coolant: used,
Evaluation item: A processing time (tool life) until the sample had been fractured was measured. Fracture means that defect is generated at the cutting blade portion of the sample.

[Cutting Test 2 Wear Resistance Test]
Insert: a cemented carbide, ASMT11T304PDPR,
Work piece material: Ti-6Al-4V,
Shape of work piece material: a plate with 250 mm×100 mm×60 mm
Cutting speed: 60 m/min,
Feed: 0.15 mm/tooth,
Depth of cut: 2.0 mm,
Cutting width: 10 mm
Coolant: used,
Evaluation item: A processing time (tool life) until the maximum flank wear width had reached 0.2 mm was measured.

The processing time (tool life) until the measured sample in Cutting test 1 had been fractured was evaluated by the following standard.
○: 25 min or longer
Δ: 20 min or longer and shorter than 25 min
x: shorter than 20 min The processing time (tool life) until the maximum flank wear width measured in Cutting test 2 had reached 0.2 mm was evaluated by the following standard.
○: 15 min or longer
Δ: 10 min or longer and shorter than 15 min
x: shorter than 10 min The order of the above-mentioned evaluation is (excellent) ○>Δ>x (poor). The sample evaluated to as ○ is excellent in cutting property. The results of the evaluation are shown in Table 5.

TABLE 5

| | Cutting test 1 Fracture resistance test | | Cutting test 2 Wear resistance test | |
|---|---|---|---|---|
| Sample No. | Processing time (min) | Evaluation | Processing time (min) | Evaluation |
| Present product 1 | 22.7 | Δ | 10.7 | Δ |
| Present product 2 | 23.7 | Δ | 11.7 | Δ |
| Present product 3 | 23.7 | Δ | 11.7 | Δ |
| Present product 4 | 24.7 | Δ | 11.7 | Δ |
| Present product 5 | 26.6 | ○ | 15.6 | ○ |
| Present product 6 | 26.0 | ○ | 14.0 | Δ |
| Present product 7 | 25.7 | ○ | 12.7 | Δ |
| Present product 8 | 26.1 | ○ | 13.1 | Δ |
| Comparative product 1 | 14.8 | X | 7.8 | X |
| Comparative product 2 | 17.7 | X | 8.7 | X |
| Comparative product 3 | 17.7 | X | 6.7 | X |
| Comparative product 4 | 21.7 | Δ | 4.7 | X |
| Comparative product 5 | 16.7 | X | 8.7 | X |
| Comparative product 6 | 16.9 | X | 8.9 | X |
| Comparative product 7 | 19.6 | X | 10.1 | Δ |

As shown in Table 5, the results of the fracture resistance test and the wear resistance test of the present products were all evaluation of ○ or Δ. The results of the fracture resistance test and the wear resistance test of the comparative products were x in either of the evaluations. As can be seen from the above results, tool life of the present products was elongated. According to the present invention, wear resistance can be improved without lowering fracture resistance of the coated cutting tool.

Example 2

As a substrate, the following two kinds of inserts were prepared.

An insert having an ISO standard CNGA120408 shape made of a cubic boron nitride sintered body with a composition of 70% cBN-20% TiN-5% $Al_2O_3$-5% $TiB_2$ (volume %)

An insert having an ISO standard ASMT11T304PDPR shape corresponding to S10 and made of a cemented carbide In the reaction vessel of an arc ion plating device, metal evaporation sources which became the compositions of the respective layers shown in Table 6 and Table 8 were arranged. The prepared substrate was fixed to a fixing metal fitting of a rotary table in the reaction vessel.

Thereafter, inside of the reaction vessel was evacuated until the pressure therein became $5.0 \times 10^{-3}$ Pa or lower. After evacuation, the substrate was heated by a heater in the reaction vessel until the temperature thereof became 500° C. After heating, an Ar gas was introduced into the reaction vessel so that the pressure in the reaction vessel became 5.0 Pa.

At an Ar gas atmosphere with a pressure of 5.0 Pa, a bias voltage with −1,000V was applied to the substrate. A current of 10 A was passed through the tungsten filament in the reaction vessel. Under such conditions, the ion bombardment treatment by an Ar gas was carried out for 30 minutes to the surface of the substrate. After completion of the ion bombardment treatment, inside of the reaction vessel was evacuated until the pressure in the reaction vessel became $5.0 \times 10^{-3}$ Pa or lower.

After evacuation, a nitrogen gas was introduced into the reaction vessel, and a pressure in the reaction vessel was made a nitrogen gas atmosphere with a pressure of 2.7 Pa. A bias voltage with −50V was applied to the substrate. Each layer of a first laminated structure and a second laminated structure constituting the inner layer was formed by evaporating the metal evaporation sources by an arc discharge with an arc current of 200 A.

When Layer A1 and Layer B1 of the present products 9 to 20 and the comparative products 8 and 9 were formed, metal evaporation sources of Layer A1 and metal evaporation sources of Layer B1 were alternately evaporated by an arc discharge to form Layer A1 and Layer B1. At this time, the thickness of Layer A1 and the thickness of Layer B1 per one layer were controlled so that these become the thickness shown in Table 7 by adjusting an arc discharge time for forming the respective layers.

When Layer A2 and Layer B2 of the present products 9 to 20 and the comparative products 8 and 9 were formed, metal evaporation sources of Layer A2 and metal evaporation sources of Layer B2 were simultaneously evaporated by an arc discharge to form Layer A2 and Layer B2. At this time, the thickness of Layer A2 and the thickness of Layer B2 per one layer were controlled so that these become the thickness shown in Table 7 by adjusting a rotation number of the rotary table within the range of 0.2 to 10 min$^{-1}$.

With regard to the present products 9 to 20 and the comparative product 9, after forming the inner layer, the reaction vessel was evacuated until the pressure therein became $5.0 \times 10^{-3}$ Pa or less, and the substrate was heated to a temperature shown in Table 9. Thereafter, a nitrogen gas and an Ar gas were introduced into the reaction vessel with a ratio of 1:1, and the pressure in the reaction vessel was made 3.0 Pa, so that the outermost layer was formed under the conditions shown in Table 9.

With regard to the comparative product 8, after forming the inner layer, the substrate was heated to a temperature shown in Table 9. Thereafter, the outermost layer was formed under the conditions shown in Table 9.

The respective layers were formed onto the surface of the substrate until these became a predetermined thickness shown in Table 7 and Table 8. Thereafter, a power of the heater was turned off, and after the temperature of the sample became 100° C. or lower, the sample was taken out from the reaction vessel.

TABLE 7

| | Coating layer | | | |
| | Inner layer | | | |
| | First laminated structure | | Second laminated structure | |
| Sample No. | LAYER A1 Average thickness (nm) | LAYER B1 Average thickness (nm) | LAYER A2 Average thickness (nm) | LAYER B2 Average thickness (nm) |
|---|---|---|---|---|
| Present product 9 | 100 | 100 | 10 | 10 |
| Present product 10 | 60 | 60 | 2 | 2 |
| Present product 11 | 250 | 250 | 10 | 10 |
| Present product 12 | 100 | 100 | 55 | 55 |
| Present product 13 | 300 | 300 | 50 | 50 |
| Present product 14 | 200 | 200 | 2 | 2 |
| Present product 15 | 100 | 100 | 10 | 10 |
| Present product 16 | 80 | 80 | 2 | 2 |
| Present product 17 | 150 | 150 | 30 | 30 |
| Present product 18 | 100 | 100 | 10 | 10 |
| Present product 19 | 100 | 100 | 10 | 10 |
| Present product 20 | 100 | 100 | 10 | 10 |
| Comparative product 8 | 100 | 100 | 10 | 10 |
| Comparative product 9 | 100 | 100 | 10 | 10 |

TABLE 6

| | Inner layer | | | |
| | First laminated structure | | Second laminated structure | |
| Sample No. | LAYER A1 Composition | LAYER B1 Composition | LAYER A2 Composition | LAYER B2 Composition |
|---|---|---|---|---|
| Present product 9 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 10 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 11 | $(Ti_{0.40}Al_{0.40}Nb_{0.20})N$ | $(Ti_{0.67}Al_{0.33})N$ | $(Ti_{0.40}Al_{0.40}Nb_{0.20})N$ | $(Ti_{0.67}Al_{0.33})N$ |
| Present product 12 | $(Ti_{0.40}Al_{0.40}Y_{0.20})N$ | $(Ti_{0.67}Al_{0.33})N$ | $(Ti_{0.40}Al_{0.40}Y_{0.20})N$ | $(Ti_{0.67}Al_{0.33})N$ |
| Present product 13 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 14 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 15 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 16 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 17 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Present product 18 | $(Ti_{0.50}Al_{0.50})N$ | $(Al_{0.50}Ti_{0.30}Cr_{0.20})N$ | $(Ti_{0.50}Al_{0.50})N$ | $(Al_{0.50}Ti_{0.30}Cr_{0.20})N$ |
| Present product 19 | $(Ti_{0.67}Al_{0.33})N$ | $(Al_{0.50}Ti_{0.45}W_{0.05})N$ | $(Ti_{0.67}Al_{0.33})N$ | $(Al_{0.50}Ti_{0.45}W_{0.05})N$ |
| Present product 20 | $(Al_{0.50}Cr_{0.50})N$ | $(Ti_{0.90}Si_{0.10})N$ | $(Al_{0.50}Cr_{0.50})N$ | $(Ti_{0.90}Si_{0.10})N$ |
| Comparative product 8 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |
| Comparative product 9 | $(Ti_{0.50}Al_{0.50})N$ | $(Ti_{0.67}Al_{0.33})N$ | $(Ti_{0.50}Al_{0.50})N$ | $(Ti_{0.67}Al_{0.33})N$ |

TABLE 8

| | Coating layer Inner layer | | | | | | | | | | | | |
|---|---|---|---|---|---|---|---|---|---|---|---|---|---|
| | First layer (Substrate side) LAYER A1 + LAYER B1 | | | Second layer LAYER A2 + LAYER B2 | | | Third layer LAYER A1 + LAYER B1 | | | Fourth layer (Surface side) LAYER A2 + LAYER B2 | | | |
| Sample No. | Laminated structure | Repeated times (times) | Average thickness (μm) | Laminated structure | Repeated times (times) | Average thickness (μm) | Laminated structure | Repeated times (times) | Average thickness (μm) | Laminated structure | Repeated times (times) | Average thickness (μm) | Average thickness (μm) |
| Present product 9 | First | 4 | 0.8 | Second | 50 | 1 | First | 4 | 0.8 | Second | 50 | 1 | 3.6 |
| Present product 10 | First | 8 | 0.96 | Second | 250 | 1 | First | 8 | 0.96 | Second | 250 | 1 | 3.92 |
| Present product 11 | First | 4 | 2 | Second | 25 | 0.5 | First | 4 | 2 | Second | 25 | 0.5 | 5 |
| Present product 12 | First | 4 | 0.8 | Second | 20 | 2.2 | First | 4 | 0.8 | Second | 10 | 1.1 | 4.9 |
| Present product 13 | First | 4 | 2.4 | Second | 36 | 3.6 | First | 4 | 2.4 | Second | 36 | 3.6 | 12 |
| Present product 14 | First | 15 | 6 | Second | 120 | 0.48 | — | — | — | — | — | — | 6.48 |
| Present product 15 | First | 6 | 1.2 | Second | 300 | 6 | — | — | — | — | — | — | 7.2 |
| Present product 16 | First | 6 | 0.96 | Second | 10 | 0.04 | First | 6 | 0.96 | Second | 10 | 0.04 | 2 |
| Present product 17 | First | 4 | 1.2 | Second | 10 | 0.6 | First | 4 | 1.2 | Second | 10 | 0.6 | 3.6 |
| Present product 18 | First | 4 | 0.8 | Second | 50 | 1 | First | 4 | 0.8 | Second | 50 | 1 | 3.6 |
| Present product 19 | First | 4 | 0.8 | Second | 50 | 1 | First | 4 | 0.8 | Second | 50 | 1 | 3.6 |
| Present product 20 | First | 4 | 0.8 | Second | 50 | 1 | First | 4 | 0.8 | Second | 50 | 1 | 3.6 |
| Comparative product 8 | First | 14 | 2.8 | Second | 250 | 5 | First | 14 | 2.8 | | | | |
| Comparative product 9 | First | 4 | 0.8 | Second | 50 | 1 | First | 4 | 0.8 | | | | |

| | Coating layer | | Average thickness of whole coating layer (μm) |
|---|---|---|---|
| | Outermost layer | | |
| Sample No. | Composition | Average thickness (μm) | |
| Present product 9 | NbN | 1 | 4.6 |
| Present product 10 | NbN | 1 | 4.92 |
| Present product 11 | NbN | 1 | 6 |
| Present product 12 | NbN | 1 | 5.9 |
| Present product 13 | NbN | 0.5 | 12.5 |
| Present product 14 | NbN | 1 | 7.48 |
| Present product 15 | NbN | 1 | 8.2 |
| Present product 16 | NbN | 1 | 3 |
| Present product 17 | NbN | 1 | 4.6 |
| Present product 18 | NbN | 1 | 4.6 |
| Present product 19 | NbN | 2 | 5.6 |
| Present product 20 | NbN | 3 | 6.6 |

TABLE 8-continued

| | | | | | | | |
|---|---|---|---|---|---|---|---|
| Comparative product 8 | Second | 250 | 5 | 15.6 | $(Al_{0.50}Cr_{0.50})N$ | 0.3 | 15.9 |
| Comparative product 9 | Second | 50 | 1 | 3.6 | NbN | 4 | 7.6 |

*"First" and "Second" at the column of "Laminated structure" mean the first laminated structure and the second laminated structure of the Present product with the corresponding number in Table 1 and Table 2.

TABLE 9

| Sample No. | Substrate temperature (° C.) | Bias voltage (V) | Arc current (A) |
|---|---|---|---|
| Present product 9 | 500 | −25 | 175 |
| Present product 10 | 500 | −20 | 165 |
| Present product 11 | 500 | −25 | 165 |
| Present product 12 | 500 | −20 | 165 |
| Present product 13 | 750 | −30 | 160 |
| Present product 14 | 500 | −20 | 165 |
| Present product 15 | 500 | −20 | 165 |
| Present product 16 | 400 | −20 | 165 |
| Present product 17 | 400 | −20 | 165 |
| Present product 18 | 500 | −15 | 170 |
| Present product 19 | 600 | −25 | 160 |
| Present product 20 | 500 | −20 | 165 |
| Comparative product 8 | 500 | −40 | 120 |
| Comparative product 9 | 600 | −40 | 145 |

The average thicknesses of the respective layers and the thicknesses of the respective laminated structure of the obtained samples were measured as follows.

Cross-sectional surfaces at the three points were observed by TEM at the neighbor of the position of 50 μm from the blade edge at the surface opposed to the metal evaporation sources of the coated cutting tool toward the center portion of said surface. The thicknesses of the respective layers and the thicknesses of the respective laminated structure were measured, and an average value of the measured thicknesses was calculated.

The compositions of the respective layers of the obtained samples were measured as follows.

The compositions were measured by using EDS at the cross-sectional surface at the position of 50 μm from the blade edge at the surface opposed to the metal evaporation sources of the coated cutting tool toward the center portion of said surface.

These measured results are also shown in Table 6, Tables 7 and 8.

Incidentally, compositional ratios of metallic elements of the respective layers in Tables 6 and 8 show an atomic ratio of the respective metallic elements based on the whole metallic elements in the metal compounds constituting the respective layers.

With regard to the obtained samples, thin film X-ray diffraction measurement of a 2θ/θ concentrated optical system using a Cu-Kα line was carried out. The measurement conditions are as follows.

Output: 50 kV, 250 mA,
Solar slit at incident side: 5°,
Divergence vertical slit: 2/3°,
Divergence vertical limit slit: 5 mm,
Scattering slit 2/3°,
Solar slit at photoreception side: 5°,
Photoreception slit: 0.3 mm,
BENT monochromator,
Photoreception monochrome slit: 0.8 mm,
Sampling width: 0.01°,
Scanning speed: 4°/min,
2θ measurement range: 30 to 70°

From the X-ray diffraction chart obtained by the thin film X-ray diffraction measurement, the peak intensity $I_c$ at the (200) plane of the cubic NbN, and the peak intensity $I_{h1}$ at the (101) plane of the hexagonal NbN were obtained. In addition, a ratio of $I_{h1}$ based on the sum of $I_c$ and $I_{h1}$ $[I_{h1}/(I_{h1}+I_c)]$ was obtained. The results are shown in Table 10.

From the X-ray diffraction chart, the sum $I_{h2}$ of the peak intensities at the (103) plane and the (110) plane of the hexagonal NbN was further obtained. In addition, a ratio of $I_{h1}$ based on the sum of $I_{h1}$ and $I_{h2}$ $[I_{h1}/(I_{h1}+I_{h2})]$ was obtained. The results are shown in Table 10.

From the X-ray diffraction chart, FWHM at the (101) plane of the hexagonal NbN was further obtained. The results are shown in Table 10.

TABLE 10

| Sample No. | $I_{h1}/(I_{h1} + I_c)$ | $I_{h1}/(I_{h1} + I_{h2})$ | FWHM (°) |
|---|---|---|---|
| Present product 9 | 0.88 | 0.70 | 0.43 |
| Present product 10 | 0.72 | 0.64 | 0.40 |
| Present product 11 | 0.69 | 0.61 | 0.41 |
| Present product 12 | 0.62 | 0.68 | 0.38 |
| Present product 13 | 0.56 | 0.54 | 0.84 |
| Present product 14 | 0.69 | 0.72 | 0.42 |
| Present product 15 | 0.65 | 0.71 | 0.40 |
| Present product 16 | 0.7 | 0.75 | 0.23 |
| Present product 17 | 0.68 | 0.68 | 0.24 |
| Present product 18 | 0.76 | 0.84 | 0.48 |
| Present product 19 | 0.58 | 0.60 | 0.55 |
| Present product 20 | 0.68 | 0.74 | 0.45 |
| Comparative product 8 | — | — | — |
| Comparative product 9 | 0.33 | 0.27 | 0.58 |

Cutting test 1 and Cutting test 2 were carried out under the same conditions as in Example 1 by using the obtained samples, and fracture resistance and wear resistance were evaluated. The evaluation results are shown in Table 11.

The processing time (tool life) until the measured sample in Cutting test 1 had been fractured was evaluated by the following standard.

○: 25 min or longer
Δ: 20 min or longer and shorter than 25 min
x: shorter than 20 min The processing time (tool life) until the maximum flank wear width measured in Cutting test 2 had reached 0.2 mm was evaluated by the following standard.

○: 15 min or longer
Δ: 10 min or longer and shorter than 15 min
x: shorter than 10 min The order of the above-mentioned evaluation is (excellent) ○>Δ>x (poor). The sample evaluated to as ○ is excellent in cutting property. The results of the evaluation are shown in Table 11.

TABLE 11

| Sample No. | Cutting test 1 Fracture resistance test | | Cutting test 2 Wear resistance test | |
|---|---|---|---|---|
| | Processing time (min) | Evaluation | Processing time (min) | Evaluation |
| Present product 9 | 28.9 | ○ | 14.9 | Δ |
| Present product 10 | 29.0 | ○ | 15.0 | ○ |
| Present product 11 | 29.3 | ○ | 16.3 | ○ |
| Present product 12 | 29.3 | ○ | 16.3 | ○ |
| Present product 13 | 29.0 | ○ | 14.0 | Δ |
| Present product 14 | 29.7 | ○ | 15.7 | ○ |
| Present product 15 | 30.0 | ○ | 16.0 | ○ |
| Present product 16 | 28.4 | ○ | 14.4 | Δ |
| Present product 17 | 28.9 | ○ | 14.9 | Δ |
| Present product 18 | 29.9 | ○ | 14.9 | Δ |
| Present product 19 | 29.7 | ○ | 16.7 | ○ |
| Present product 20 | 31.5 | ○ | 17.5 | ○ |
| Comparative product 8 | 14.7 | X | 14.7 | Δ |
| Comparative product 9 | 19.9 | X | 12.3 | Δ |

As shown in Table 11, the results of the fracture resistance test and the wear resistance test of the present products were all evaluation of ○ or Δ. The results of the fracture resistance test and the wear resistance test of the comparative products were x in either of the evaluations. As can be seen from the above results, tool life of the present products was elongated. According to the present invention, wear resistance can be improved without lowering fracture resistance of the coated cutting tool.

INDUSTRIAL APPLICABILITY

The coated cutting tool of the present invention is excellent in wear resistance, chipping resistance and fracture resistance. According to the present invention, tool life can be elongated than the conventional ones. Accordingly, industrial applicability of the present invention is high.

EXPLANATION OF REFERENCE NUMERALS

1 Substrate
2 Coating layer
3 Outermost layer
4 First laminated structure
5 Second laminated structure
6a Layer A1 constituting first laminated structure
6b Layer B1 constituting first laminated structure
7a Layer A2 constituting second laminated structure
7b Layer B2 constituting second laminated structure

The invention claimed is:

1. A coated cutting tool which comprises a substrate and a coating layer formed onto a surface of the substrate, wherein
the coating layer contains an outermost layer,
the outermost layer contains NbN,
the NbN contains cubic NbN and hexagonal NbN,
when a peak intensity at a (200) plane of the cubic NbN by X-ray diffraction analysis is made $I_c$, a peak intensity at a (101) plane of the hexagonal NbN is made $I_{h1}$, and a sum of peak intensities at a (103) plane and a (110) plane of the hexagonal NbN is made $I_{h2}$, then a ratio $[I_{h1}/(I_{h1}+I_C)]$ of $I_{h1}$ based on a sum of $I_c$ and $I_{h1}$ is 0.5 or more and less than 1.0, and a ratio $[I_{h1}/(I_{h1}+I_{h2})]$ of $I_{h1}$ based on a sum of $I_{h1}$ and $I_{h2}$ is 0.5 or more and 1.0 or less.

2. The coated cutting tool according to claim 1, wherein a full width at half maximum intensity of a peak at the (101) plane of the hexagonal NbN is 0.2° or more and 0.6° or less.

3. The coated cutting tool according to claim 1, wherein the NbN contains 25 atomic % or less of at least one kind of an element selected from the group consisting of Ti, Zr, Hf, V, Ta, Cr, Mo, W, Al, Si, Sr and Y.

4. The coated cutting tool according to claim 1, wherein an average thickness of the outermost layer is 0.05 μm or more and 3 μm or less.

5. The coated cutting tool according to claim 1, wherein the coating layer contains an inner layer between the substrate and the outermost layer, and
the inner layer is one or a plural number of layers containing a compound (excluding NbN) which contains at least one kind of an element selected from the group consisting of Ti, Zr, Hf, V, Nb, Ta, Cr, Mo, W, Al, Si, Sr and Y, and at least one kind of an element selected from the group consisting of C, N, O and B.

6. The coated cutting tool according to claim 1, wherein the coating layer contains an inner layer between the substrate and the outermost layer,
the inner layer contains a first laminated structure and a second laminated structure,
the first laminated structure contains at least two kinds of layers having different compositions, the two kinds of the layers are alternately laminated twice or more, and an average thickness of the layers contained in the first laminated structure is 60 nm or more and 500 nm or less,
the second laminated structure contains at least two kinds of layers having different compositions, the two kinds of the layers are alternately laminated twice or more, and an average thickness of the layers contained in the second laminated structure is 2 nm or more and less than 60 nm, and
the layers contained in the first laminated structure and the second laminated structure contain a compound (excluding NbN) which contains at least one kind of a metallic element selected from the group consisting of Ti, Zr, Hf, V, Nb, Ta, Cr, Mo, W, Al, Si, Sr and Y, and at least one kind of a nonmetallic element selected from the group consisting of C, N, O and B.

7. The coated cutting tool according to claim 6, wherein the first laminated structure and the second laminated structure contained in the inner layer are alternately laminated twice or more continuously.

8. The coated cutting tool according to claim 6, wherein an average thickness of the first laminated structure is 0.2 μm or more and 6μm or less.

9. The coated cutting tool according to claim 6, wherein an average thickness of the second laminated structure is 0.02 μm or more and 6μm or less.

10. The coated cutting tool according to claim 5, wherein an average thickness of the inner layer is 0.22 μm or more and 12 μm or less.

11. The coated cutting tool according to claim 1, wherein an average thickness of the whole coating layer is 0.5 μm or more and 15 μm or less.

12. The coated cutting tool according to claim 1, wherein the substrate comprises at least one kind of material selected from the group consisting of a cemented carbide, a cermet, ceramics, a cubic boron nitride sintered body, a diamond sintered body and a high speed steel.

13. The coated cutting tool according to claim 6, wherein an average thickness of the inner layer is 0.22 μm or more and 12 μm or less.

14. The coated cutting tool according to claim 1, wherein:
a full width at half maximum intensity of a peak at the (101) plane of the hexagonal NbN is 0.2° or more and 0.6° or less; and
the NbN contains 25 atomic % or less of at least one kind of an element selected from the group consisting of Ti, Zr, Hf, V, Ta, Cr, Mo, W, Al, Si, Sr and Y.

15. The coated cutting tool according to claim 14, wherein an average thickness of the outermost layer is 0.05 μm or more and 3μm or less.

16. The coated cutting tool according to claim 15, wherein the coating layer contains an inner layer between the substrate and the outermost layer, and
the inner layer is one or a plural number of layers containing a compound (excluding NbN) which contains at least one kind of an element selected from the group consisting of Ti, Zr, Hf, V, Nb, Ta, Cr, Mo, W, Al, Si, Sr and Y, and at least one kind of an element selected from the group consisting of C, N, O and B.

17. The coated cutting tool according to claim 15, wherein the coating layer contains an inner layer between the substrate and the outermost layer,
the inner layer contains a first laminated structure and a second laminated structure,
the first laminated structure contains at least two kinds of layers having different compositions, the two kinds of the layers are alternately laminated twice or more, and an average thickness of the layers contained in the first laminated structure is 60 nm or more and 500 nm or less,
the second laminated structure contains at least two kinds of layers having different compositions, the two kinds of the layers are alternately laminated twice or more, and an average thickness of the layers contained in the second laminated structure is 2 nm or more and less than 60 nm, and
the layers contained in the first laminated structure and the second laminated structure contain a compound (excluding NbN) which contains at least one kind of a metallic element selected from the group consisting of Ti, Zr, Hf, V, Nb, Ta, Cr, Mo, W, Al, Si, Sr and Y, and at least one kind of a nonmetallic element selected from the group consisting of C, N, O and B.

18. The coated cutting tool according to claim 17, wherein the first laminated structure and the second laminated structure contained in the inner layer are alternately laminated twice or more continuously.

19. The coated cutting tool according to claim 18, wherein an average thickness of the first laminated structure is 0.2 μm or more and 6 μm or less.

20. The coated cutting tool according to claim 19, wherein an average thickness of the second laminated structure is 0.02 μm or more and 6 μm or less.

* * * * *